US005095268A

United States Patent [19]

Salmela et al.

[11] Patent Number: 5,095,268

[45] Date of Patent: Mar. 10, 1992

[54] TOOL FOR TUNING MICROWAVE CIRCUIT WITHIN A CLOSED HOUSING

[75] Inventors: Gordon O. Salmela, Lexington; Brian M. Foley, Brockton; David C. Collins, Burlington, all of Mass.

[73] Assignee: Raytheon Company, Lexington, Mass.

[21] Appl. No.: 572,071

[22] Filed: Jun. 29, 1990

[51] Int. Cl.[5] ........................ G01R 1/06; G01R 31/02; G01R 1/38

[52] U.S. Cl. .................................. 324/158 P; 324/74; 324/157 F

[58] Field of Search ............... 324/158 P, 158 F, 72.5, 324/95, 74; 200/530, 532, 540

[56] References Cited

U.S. PATENT DOCUMENTS 3,950,627 4/1976 Murata et al. ...................... 200/530

4,596,912 6/1986 Hattori ............................... 200/530

4,818,828 4/1989 Curley et al. ....................... 200/532

*Primary Examiner*—Ernest F. Karlsen

*Attorney, Agent, or Firm*—Christopher L. Maginniss; Richard M. Sharkansky

[57] ABSTRACT

A production circuit tuning tool consisting of a cover and a number of feed-through, gold-tipped probes that adjust the performance of an underlying circuit. The probes are positioned in the cover so that they may act as temporary jumpers between the trace wiring and tuning patches on the circuit substrate. The portion of the probe that bridges the patches comprises a slender nonconductive plunger of low dielectric constant material having a gold plated tip. Once the proper combination of jumpers is determined, the tuning tool cover is removed, permanent jumpers are soldered into place and a regular production cover is installed.

13 Claims, 5 Drawing Sheets

TOOL FOR TUNING MICROWAVE CIRCUIT WITHIN A CLOSED HOUSING

The Government has rights to this invention pursuant to Contract No. DAAH01-87-C-A025, awarded by the Department of the Army.

BACKGROUND OF THE INVENTION

The present invention relates generally to microwave circuits and, more particularly, to an assembly for covering a housing which encloses a microwave circuit, wherein the cover assembly includes externally-accessible probes for providing tuning of the microwave circuit while the cover assembly is in place on the housing.

A typical microwave hybrid integrated circuit (MHIC) module may comprise a plurality of ceramic substrates, the substrates including resistive, capacitive and active components soldered to a surface and further including gold circuit traces deposited on a polished surface for interconnecting the components. The component-mounted substrates are typically mounted side by side in an aluminum housing, interconnected by gold jumper wires and enclosed within the housing via an aluminum cover. At the microwave frequencies of interest, the geometry of the gold circuit paths on the substrates, and their locations with respect to each other and to the surrounding housing (particularly including the cover), creates inductive and capacitive effects.

The total assembly, including the component-mounted substrates within the housing, is tuned for gain and "noise figure" over the frequency band of interest. This tuning may typically be accomplished by connecting jumper wires from the main circuit traces to small tuning patches adjacent a trace path or at the end of a branch. Although the tuning patches are quite small, illustratively 0.02 in. (0.5 mm) by 0.06 in. (1.5 mm), they have a significant influence on the performance of the circuit when they are connected, by slightly increasing the area or length of the associated trace.

Unfortunately, the subsequent installation of the cover on the aluminum housing after the above-described tuning procedure has a far greater impact on circuit performance than the interconnection of the internal tuning patches and jumpers. Clearly, the cover must be in place before the assembly can be finally tested, but the presence of the installed cover would ordinarily preclude further adjustment, as it covers the circuits.

It has been the practice in the past to make educated guesses regarding the soldering of tuning patches to the circuit traces during a series of iterations involving the affixing of the cover, testing for the above-described gain and noise parameters, and removal of the cover. This time-consuming procedure may be further exacerbated by a large number of cover screws, all of which must be completely in place before the electrical testing may be performed with accuracy. It is not unusual to find that an average of eight such tuning iterations are required for each MHIC module before it meets its electrical specification.

Clearly, this form of iterative tuning procedure creates a bottleneck in any circuit production facility. What is required is a real-time procedure for tuning the circuits via jumpers to the tuning patches while in an environment which accurately simulates the enclosed housing.

SUMMARY OF THE INVENTION

It is therefore a primary object of the present invention to provide a means for tuning a microwave circuit within an environment simulating an enclosed housing.

It is a further object of the present invention to provide a tool for enabling electrical tuning adjustments to a microwave circuit within a closed housing.

It is a still further object of the present invention to provide a tuning cover for enclosing a housing containing microwave circuits, wherein the tuning cover includes externally-accessible means for making tuning adjustments to the microwave circuits.

These and other objects of this invention are obtained generally by providing a cover assembly for enclosing a housing which contains a printed wiring circuit board. The cover assembly comprises a cover plate adapted for covering the housing, the cover plate having an aperture therethrough, and a probe extending through the aperture, the probe having an electrically conductive tip, the probe being movable between an extended position and a retracted position. The extended position of the probe locates the conductive tip in electrical contact with a printed wiring trace of the circuit board, while the retracted position of the probe withdraws the conductive tip away from the circuit board.

In a preferred embodiment of the present invention, the cover assembly includes a plurality of probes extending through a corresponding plurality of apertures in the cover plate. The plurality of probes may include a first type of probe which provides a single extended position, connecting a printed wiring trace to a patch; a second type of probe which provides two extended positions, selectively connecting either of two patches to a printed wiring trace; and a third type of probe which provides three extended positions, selectively connecting either or both of two patches to a printed wiring trace.

With this arrangement it is possible to tune a microwave circuit within an enclosed housing by the use of a tuning cover assembly which accurately simulates the actual housing cover.

BRIEF DESCRIPTION OF THE DRAWINGS

Other features and advantages of the present invention will be more fully understood from the following detailed description of the preferred embodiment, the appended claims, and the accompanying drawings, in which:

DESCRIPTION OF THE PREFERRED EMBODIMENT

Figure 1:
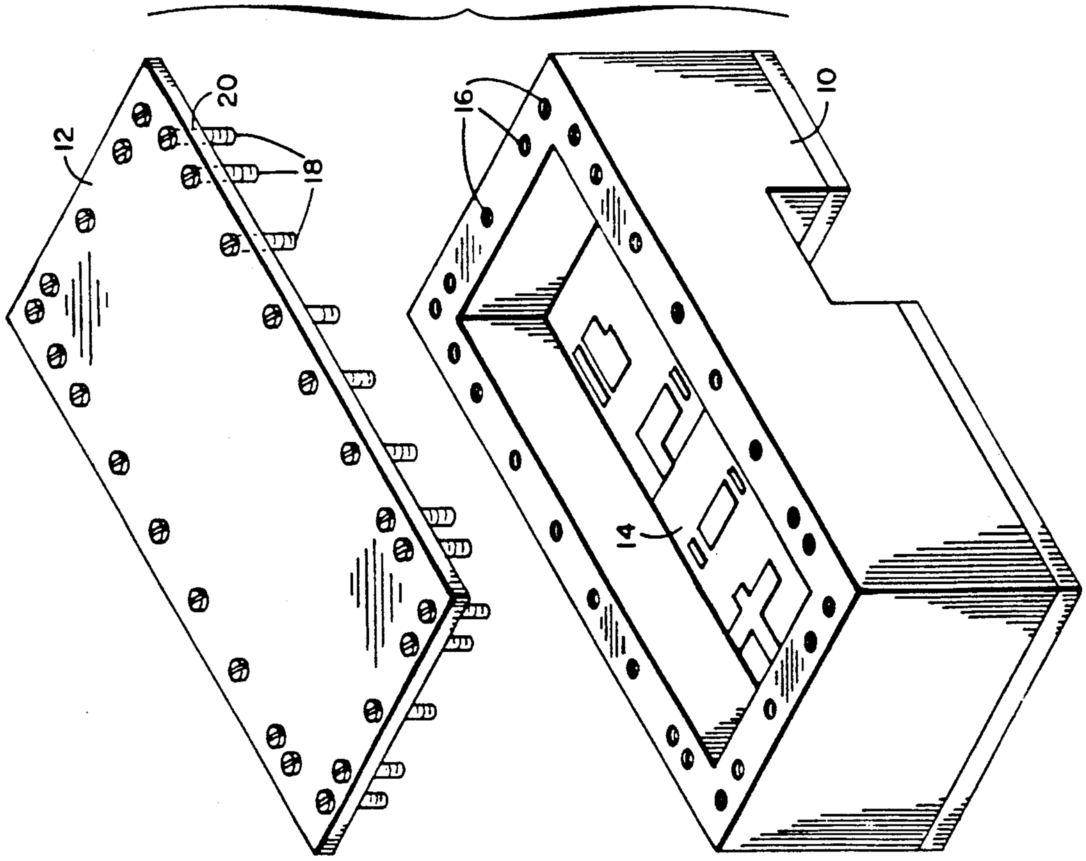
FIG. 1 illustrates a typical microwave circuit module housing shown with a conventional housing cover.

Referring to FIG. 1, there is shown a microwave circuit module housing 10 shown detached from its conventional cover 12. Housing 10 contains therein a printed wiring circuit module 14 and includes, along its periphery, a plurality of threaded apertures 16. Cover 12 is securely affixed to housing 10 via a corresponding plurality of screws 18 which extend through apertures 20 in conventional cover 12 into threaded apertures 16. The present invention relates to a tuning cover assembly which temporarily replaces conventional cover and thereby enables an initial circuit adjustment process of tuning the microwave circuit module 14 for gain and noise figure over a range of frequencies.

Figure 2:
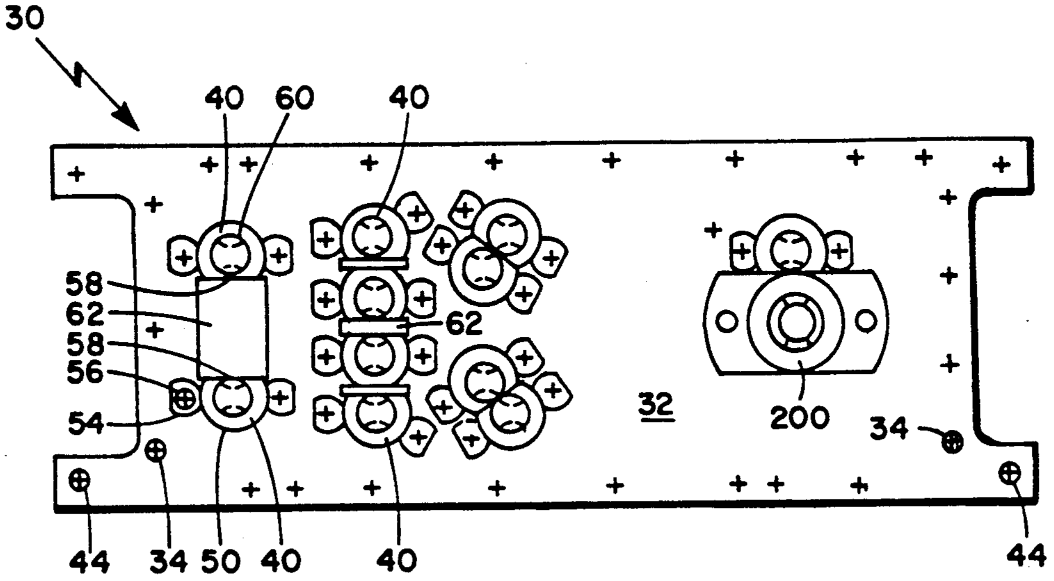
FIGS. 2 and 3 are plan and side views, respectively, of the tuning cover assembly according to the present invention.
Figure 3:
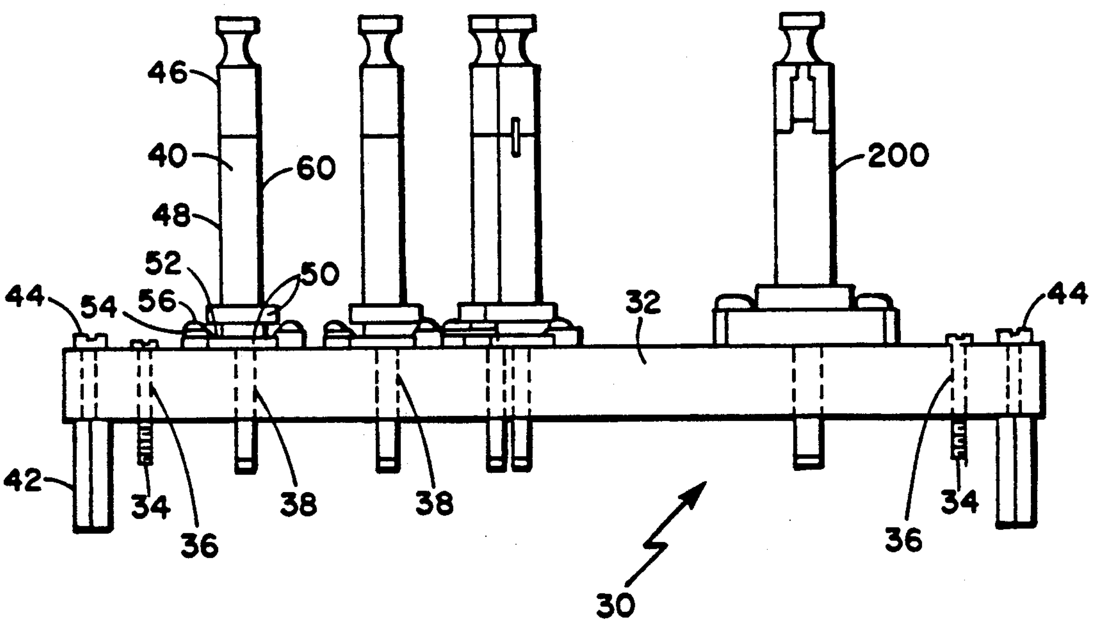

FIGS. 2 and 3 are plan and side views, respectively, of the tuning cover assembly 30 of the present invention for use with the microwave hybrid integrated circuit housing 10 of FIG. 1, replacing conventional cover 12 during the circuit tuning process. Cover assembly 30 includes a cover plate 32, illustratively fabricated of aluminum hard-coated with nickel; fastening means 34, illustratively a plurality of machine screws, for attaching cover plate 32 through apertures 36 along the periphery thereof to corresponding threaded apertures 16 in the microwave circuit housing 10 (not shown); and a plurality of probes 40 (twelve are illustrated) extending through apertures 38 in cover plate 32. Also attached to cover plate 32 are four feet 42, illustratively attached via screws 44. Feet 42, which extend from the bottom surface of cover plate 32 beyond the extended lengths of the tips of probes 40, protect the probe tips from incidental, potentially-injurious contact while cover assembly 30 is not attached to the microwave circuit housing.

Probes 40 each include a movable, spring-loaded plunger 46 within a stationary probe housing 48. Probe housing 48 comprises a tubular member 60, typically fabricated of stainless steel, with a mounting flange 50 and a locating pilot 58. Probes 40 are held securely to cover plate 32 via cams 54 which engage a recess 52 in flange 50; cams 54 are held to cover plate 32 by screws 56. Locating pilots 58 comprise flat surfaces in probe housing 48 which mount flush against pilot alignment structures 62 on cover plate 32 or which mount flush against the locating pilot 58 of an adjacent probe 40.

Figure 4:
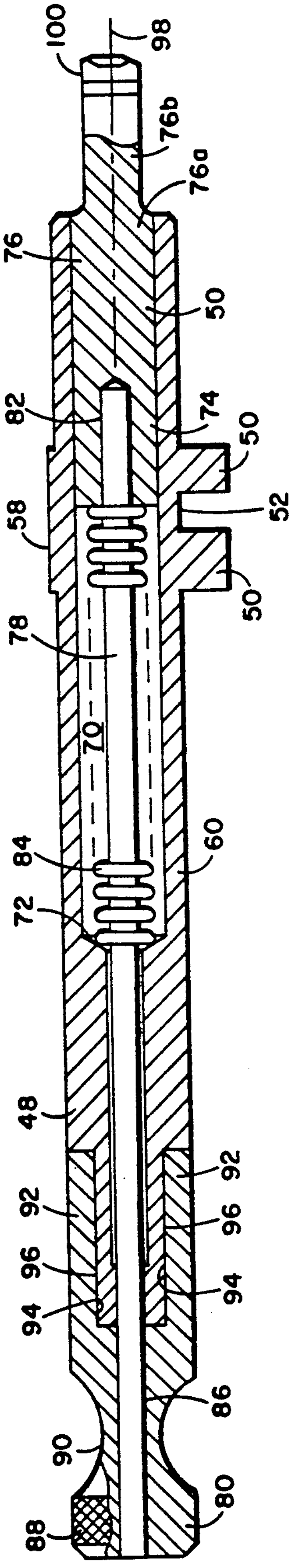
FIG. 4 is a partly cutaway view of a probe for use in the tuning cover assembly of FIGS. 2 and 3.

Referring to FIG. 4, there is shown a partially cross-sectional view of probe 40, which may be similar to any one or more of the probes of FIGS. 2 and 3. Probe 40 includes a generally cylindrical tubular probe housing 48 which is illustratively fabricated of stainless steel. Housing 48 includes mounting flange 50 and locating pilot 58; their function for attachment of probe housing 48 to cover plate 32 was described in the preceding paragraph. A central bore 70 through housing 48 includes a shoulder 72 where there is a change in diameter of central bore 70.

Probe 40 additionally includes plunger 74 which is capable of longitudinal and rotational movement within the central bore 70 of housing 48. Plunger 74 comprises three elements: a tip portion 76, a control rod 78 and a cap 80.

Tip portion 76 comprises a rod having a first cylindrical section **76*a* of a first diameter, stepped down to a second cylindrical section 76*b* of a second diameter. In the present example, tip portion 76 is fabricated of alumina and is 0.885 in. (2.25 cm) in length; the diameter of the first section 76*a* is 0.188 in. (4.78 mm) and the diameter of the second section 76*b* is 0.125 in. (3.18 mm). Probe tip 100, at the free end of the smaller-diameter section 76*b* of tip portion 76**, is illustrated in detail in FIG. 5 and described in the accompanying text.

Control rod 78 intrudes into an axial hole 82 drilled into the larger-diameter section **76*a* of tip portion 76, where it is bonded, preferably using a heat-cured epoxy adhesive. The material of control rod 78 is selected to match the thermal expansion of the material of tip portion 76; in the preferred embodiment control rod 78 is fabricated of titanium, which has a coefficient of thermal expansion sufficiently matched to that of alumina. In the present example, the diameter of control rod 78** is 0.062 in. (1.6 mm).

Prior to the insertion of the bonded assembly comprising control rod 78 and tip portion 76 into housing 48, a compression spring 84 is slipped over the free end of control rod 78 where one end rests against the larger-diameter end of tip portion 76. When this assembly is inserted within the central bore 70 of probe housing 48, the other end of spring 84 rests against shoulder 72 of central bore 70. Spring 84 is selected such that while probe 40 is in its extended position, tip portion 76 exerts a force on the underlying circuit board of, illustratively, one pound.

Cap 80, preferably fabricated of titanium, has an axial hole 86 through which control rod 78 extends and is welded thereto. It will be recognized from the preceding paragraph that when cap 80 is welded to control rod 78, spring 84 will be in compression within central bore 70. Cap 80 includes a knurled surface 88 and recessed area 90 to enhance finger contact when manipulating plunger 74 for axial and rotational movement.

The portion of cap 80 adjacent housing 48 includes a fork-like structure 92 adapted to engage a mating structure in housing 48. The fork-like structure 92 includes two tines having flat inner surfaces 94 which mate with corresponding flat surfaces 96 on housing 48. This mating arrangement ensures that when plunger 74 is retracted by manually withdrawing cap 80 away from cover plate 32 against the compression forces of spring 84, probe tip 100 will be lifted directly off the underlying circuit board without twisting. This arrangement also ensures correct placement of the tip 100 with respect to the printed wiring traces of the circuit board. In the retracted position, that is, when surfaces 94 of cap 80 are not in engagement with surfaces 96 of housing 84, the contact area of tip 100 is substantially aligned with the bottom (inner) surface of cover plate 32.

Figure 5:
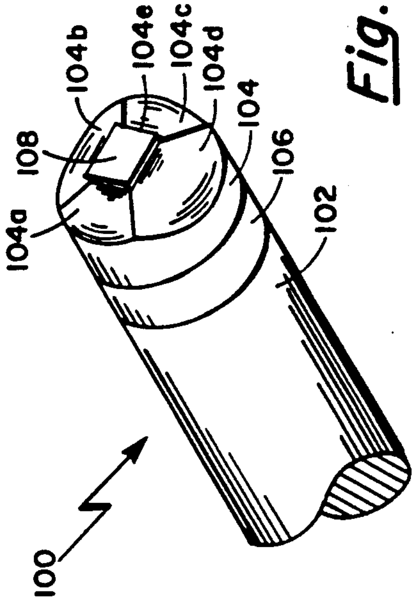
FIG. 5 is a magnified view of the tip of the probe illustrated in FIG. 4.

Referring to FIG. 5, there is shown an enlarged view of an illustrative probe tip 100. The view of FIG. 5 includes a section 102 of the stepped-down cylinder of the alumina tip portion 76 of plunger 74 of FIG. 4, and a contact tip 104, which is illustratively a round alumina disk 0.050 in. (1.3 mm) thick and substantially equal in diameter to the diameter of section 102. Contact tip 104 is spaced from section 102 by a layer 106 of a compliant material, illustratively a disk of 60 durometer butyl rubber 0.030 in. (0.76 mm) thick and substantially equal in diameter to the diameters of section 102 and contact tip 104. Compliant layer 106 is fastened to the alumina portions 102 and 104 of probe 100 using suitable adhesive means, illustratively cyanoacrylate in the preferred embodiment.

Beveled surfaces **104*a*, 104*b*, 104*c* and 104*d* are formed on the exposed face of contact tip 104, thereby reducing the contact area 104*e* to a small rectangle, typically 0.030 in. (0.76 mm) by 0.060 in. (1.5 mm). In the present example, surfaces 104***a*, 104*b*, 104*c* and 104*d* are beveled from surface 104*e* at an angle of approximately 25 degrees. The beveling of the exposed surface of contact tip 104 determines the position of the contact area 104*e* relative to the longitudinal (rotational) axis 98 (see FIG. 4) of tip portion 76. If contact tip 104 is beveled such that contact area 104*e* is symmetrical with respect to axis 98, then rotation of plunger 74 to a fixed stop 180° away will not alter the position of contact area 104*e* relative to traces on the underlying circuit board. However, if contact tip 104 is beveled so as to produce a contact area 104*c* which is eccentrically placed with respect to axis 98, then rotation of plunger 74 to a fixed stop 180° away will change the position of contact area 104*e* relative to the circuit board traces.

The rectangular area 104*e* at the end of contact tip 104 is made electrically conductive, typically by a gold plating 108, the thickness of which is shown in highly exaggerated scale in FIG. 5. Gold plating 108 is preferably electrodeposited on the flat contact area 104*e* and may illustratively be 600 angstroms in thickness. Compliant layer 106, in conjunction with the one pound spring force described earlier, is sufficient to tilt contact tip 104 several degrees in order to align the contact area 104*e* with the surface of the circuit board and thereby ensure good electrical contact.

Ideally, probe 40 would apply a temporary jumper between printed wiring traces, via the plated contact tip 104, without introducing any other material into the enclosure of the microwave housing. Within the purview of this invention, this goal is best achieved by the use of a slender non-conductive tip portion 76 fabricated of a material of low loss and low dielectric constant. In the preferred embodiment, alumina was selected for tip portion 76 over materials with superior electrical qualities because its high mechanical strength allows it to have a very small diameter. The correspondingly small volume of tip portion 76 more than compensates for the high relative dielectric value of this ceramic material. In addition, the butyl rubber selected for use in the preferred embodiment also has the characteristics of low loss and low dielectric constant.

In addition to the probes 40 described earlier, the present invention also includes a probe 200 having an additional level of complexity. In addition to having a probe tip with an eccentrically positioned contact tip, probe 200 further includes a rotatable internal housing providing eccentric positioning of the probe tip. With this arrangement, at least one additional position of contact of the probe tip with the underlying circuit board may be obtained.

Figure 6:
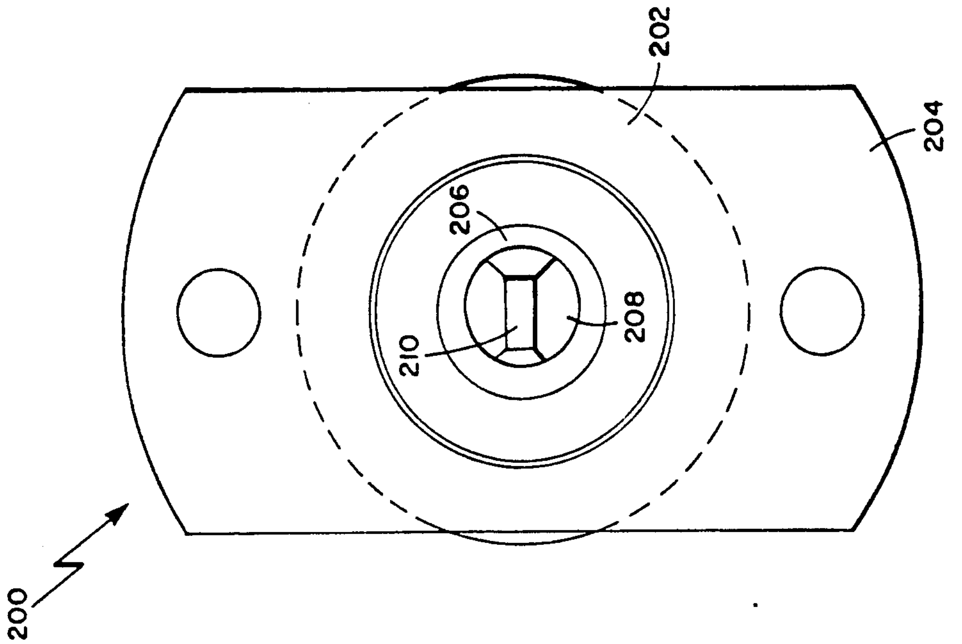
FIG. 6 is a bottom view of a modified probe for use in the tuning cover assembly of FIGS. 2 and 3.

Referring to FIG. 6, there is shown a bottom view of probe 200, illustrating the components which permit the tip of probe 200 to be located at least three distinct contact positions. Probe 200 includes a fixed external housing 202 attached to mounting flange 204. Within fixed housing 202 is a rotatable housing 206, and within rotatable housing 206 is a rotatable plunger 208. Rotatable housing 206 and rotatable plunger 208 both include mating structures which engage fixed housing 202 so as to constrain their positions for which the probe tip is extended to two positions, each position being spaced apart by 180°.

As may be observed from FIG. 6, the tip of plunger 208 is beveled so that contact area 210 is offset a small distance from the center of the tip. Furthermore, it will be observed that plunger 208 is offset a small distance from the central axis of rotatable plunger 206. The effect of the first-mentioned offset, that of contact area 210 from the center of plunger 208, as presently shown, is to shift the contact area 210 to the right when plunger 208 is rotated 180° with respect to rotatable housing 206. The effect of the second-mentioned offset, that of plunger 208 from the center of rotatable housing 206, as presently shown, is to shift contact area 210 to the left when rotatable housing 206 is rotated 180° with respect to fixed housing 202. As will be understood, the total effect of these two offsets is to allow as many as four positions of contact area 210 with respect to the underlying circuit board. However, in the present embodiment, the firstmentioned offset is equal to the second-mentioned offset; thus, when plunger 208 is positioned such that contact area 210 is toward the left (as shown) and rotatable housing 206 is positioned such that plunger 208 is toward the right (as shown), rotation of both plunger 208 and rotatable housing 206 through 180° will result in effectively no lateral movement of contact area 210 with respect to an underlying circuit board.

Figure 7:
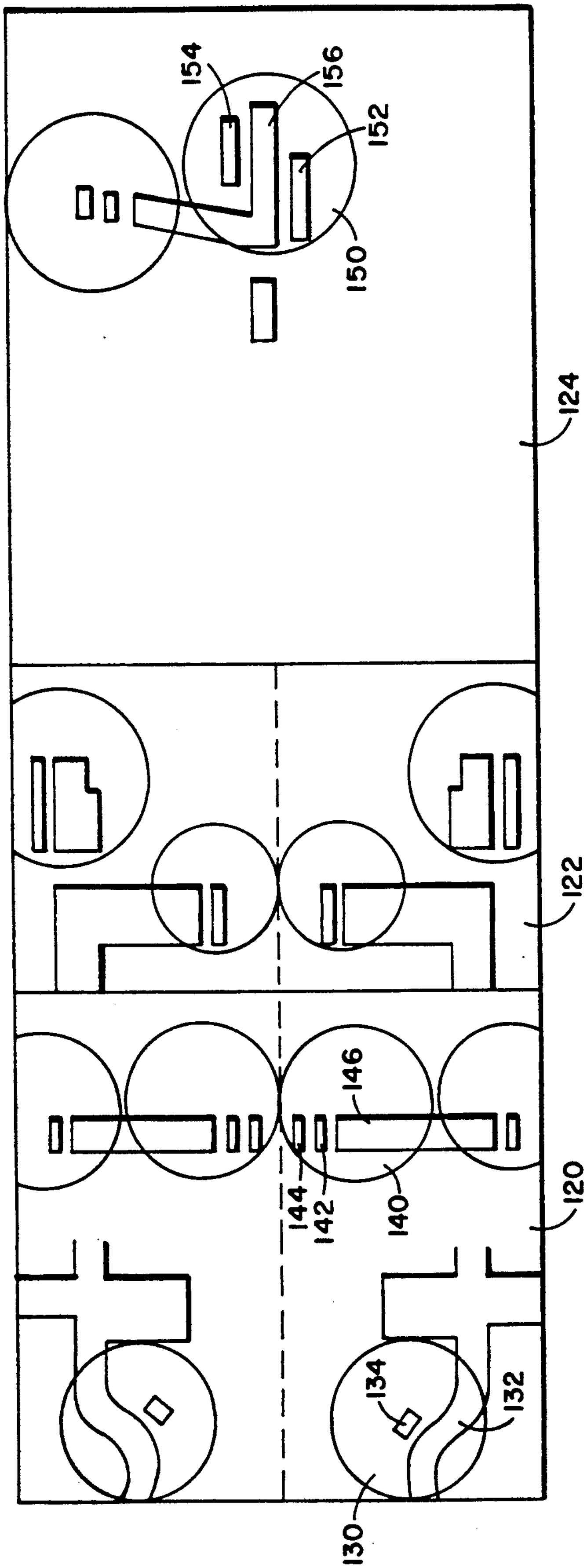
FIG. 7 is a plan view of a microwave circuit module including tuning patches for use with the tuning cover assembly of FIGS. 2 and 3.

Referring to FIG. 7, there is shown a plan view of a portion of an MHIC module, depicting three hybrid modules 120, 122 and 124, and illustrating exemplary circuit traces and tuning patches adjacently located. By way of a first example, zone 130 depicts a printed wiring trace 132 and an adjacent patch 134 which may either be shorted together or remain unconnected in accordance with the tuning requirements of the circuit. In a second example, shown in zone 140, circuit tuning may be effected by shorting just patch 142 or both patches 142 and 144 to the branch end comprising printed wiring trace 146. Finally, a third example of tuning, shown in zone 150, is accomplished by shorting either patch 152 or patch 154 or both patches 152 and 154 to circuit trace 156.

Figure 8A:
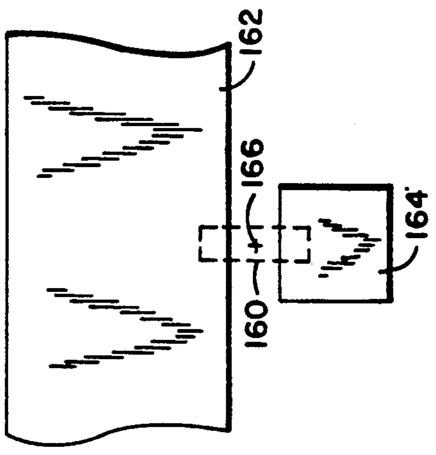
FIG. 8*a*, 8*b* and 8*c* illustrate how the tuning cover assembly of FIGS. 2 and 3 is used to interconnect microwave circuit traces with one or more tuning patches.
Figure 8B:
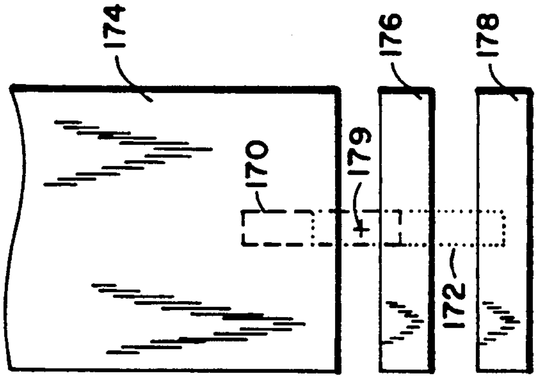
Figure 8C:
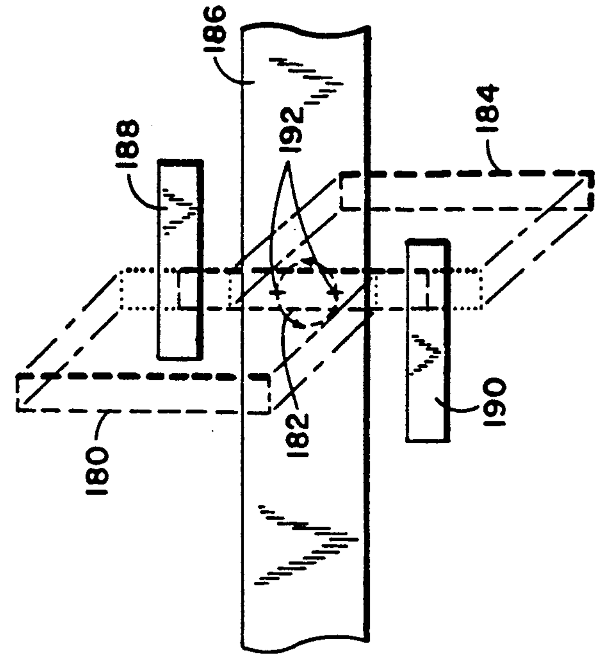

Referring to FIGS. 8*a*–8*c*, there are shown diagrams of specific examples of methods by which probes 40 and probe 200 of cover assembly 30 provide temporary jumpers between printed circuit wiring traces and printed circuit patches. FIG. 8*a* illustrates the position 160 of a temporary jumper which provides electrical continuity between printed circuit trace 162 and patch 164. FIG. 8*b* illustrates the two positions 170 and 172 of a temporary jumper which provides, in a first position 170, electrical contact between printed circuit trace 174 and patch 176; and, in a second position 172, contact among trace 174 and patches 176 and 178. FIG. 8*c* illustrates the three positions 180, 182 and 184 of a temporary jumper which provides, in a first position 180, electrical contact between printed circuit trace 186 and patch 188; in a second position 182, contact between trace 186 and patch 190; and, in a third position 184, contact among trace 186 and patches 188 and 190. In each of the cases illustrated by FIGS. 7*a*–7*c*, the probe may be retracted so as to avoid any contact.

In the arrangement of FIG. 8*a*, the contact tip which provides the temporary jumper at position 160 is symmetrically placed with respect to the rotational axis 166 of the probe. Thus, when the probe of the FIG. 8*a* arrangement is rotated between its two locking positions 180° apart, it has effectively only one contact position 160.

In the arrangement of FIG. 8*b*, the contact tip which provides the temporary jumper selectively at position 170 or at position 172 is asymmetrically placed with respect to the rotational axis 179 of the probe. Thus, the probe may be rotated to contact position 170, shorting trace 174 to patch 176; and it may be rotated an additional 180° to contact position 172, shorting trace 174 to both patches 176 and 178.

The arrangement of FIG. 8*c* employs a probe of the type shown as probe 200 (in FIG. 6). The contact tip which provides the temporary jumper selectively at the first position 180, the second position 182 or the third position 184 is asymmetrically placed with respect to the rotational axis 192 of the plunger and, in addition, the plunger includes a rotatable housing eccentrically positioned within the fixed housing mounted to the tuning cover. As a result, as the plunger and rotatable housing are rotated, the contact area moves with respect to the surface of the underlying circuit board. Thus, the probe may be located to contact position 180, shorting trace 186 to patch 188; by rotating either the plunger or the rotatable housing by 180°, the contact area is shifted down to contact position 182, thereby shorting trace 186 to both patches 188 and 190; and by rotating the other (as between the plunger and the rotatable housing) by 180°, the contact area is shifted further down to contact position 184, thereby shorting trace 186 only to patch 190.

The invention disclosed herein may be used in the production of microwave hybrid integrated circuit modules in accordance with the following illustrative procedure: cover assembly 30 is securely attached to housing 10 by tightening down screws 34. Using a test setup for measuring the gain and noise figure, etc. of the MHIC module over the frequency range of interest, including, as an example, signal generators, noise source, noise figure meter, oscilloscope, frequency counter, amplifiers and power supplies (all not shown), the performance of the MHIC module is monitored. Probes 40 (and probe 200) are manipulated, temporarily coupling various printed wiring patches to the printed wiring traces on the circuit board within the enclosed housing, and the effect on performance is observed. When a particular combination of probe jumper selections appears to provide satisfactory performance of the module, the positions of each of the probes is recorded and the cover assembly is removed. Permanent gold jumpers having substantially the same dimensions as the gold layers 106 of contact tips 104 of probes 40 (and probe 200) are soldered to the circuit board traces according to the recorded data, and the conventional cover 12 is attached to housing 10. Thus, the module tuning procedure, previously requiring many iterative steps involving attachment and removal of the housing cover, is completed after only one tuning step.

While the principles of the present invention have been demonstrated with particular regard to the illustrated structure of the figures, it will be recognized that various departures may be undertaken in the practice of the invention. The scope of this invention is not intended to be limited to the particular structure disclosed herein, but should instead be gauged by the breadth of the claims which follow.

What is claimed is:

1. A cover assembly for enclosing a housing, said housing container a printed wiring circuit board, said cover assembly comprising:

a cover plate adapted for covering said housing, said cover plate having an aperture therethrough; and a probe extending through said aperture, said probe having an electrically conductive tip, said probe being movable between an extended position and a retracted position, said probe further including spring means biased so as to urge said probe to said extended position;

wherein said extended position of said probe is adapted to locate said conductive tip in electrical contact with a printed wiring trace of said circuit board, and wherein said retracted position of said probe is adapted to withdraw said conductive tip away from said circuit board.

2. The cover assembly according to claim 1 further including means coupled to said cover plate for attaching said cover plate to said housing.

3. The cover assembly according to claim 1 wherein said cover plate has a plurality of apertures, said cover assembly further including a corresponding plurality of probes extending through said apertures, each of said plurality of probes having an electrically conductive tip and being movable between an extended position and a retracted position.

4. The cover assembly according to claim 1 wherein said conductive tip of said probe is adapted to provide an electrical path between said printed wiring trace on said circuit board and a printed tuning patch on said circuit board.

5. The cover assembly according to claim 4 wherein said probe is additionally movable to a second extended position, wherein said second extended position is adapted to locate said conductive tip of said probe so as to provide and electrical path between said printed wiring trace on said circuit board and a second tuning patch on said circuit board.

6. The cover assembly according to claim 5 wherein said probe is additionally movable to a third extended position, wherein said third extended position is adapted to locate said conductive tip of said probe so as to provide an electrical path among said printed wiring trace on said circuit board and said first-mentioned and said second tuning patches on said circuit board.

7. The cover assembly according to claim 1 further including means for moving said probe between said extended position and said retracted position, said moving means being located on the opposite side of said cover plate from said circuit board.

8. The cover assembly according to claim 1 wherein said probe includes means for providing efficacious contact between said conductive tip and said printed wiring trace.

9. The cover assembly according to claim 8 wherein said contact providing means includes means adapted to align said conductive tip against said printed wiring trace when said probe is urged to said extended position.

10. The cover assembly according to claim 1 wherein said probe has a generally cylindrical shape having a longitudinal axis, said probe comprising two coaxial rigid portions abutted to an intermediate compliant portion.

11. The cover assembly according to claim 10 wherein said two rigid portions of said probe are fabricated of a nonconductive ceramic material.

12. The cover assembly according to claim 11 wherein said ceramic material comprises alumina.

13. The cover assembly according to claim 10 wherein said compliant portion comprises butyl rubber.

* * * * *